US012639501B2

(12) United States Patent
Alnahari et al.

(10) Patent No.: US 12,639,501 B2
(45) Date of Patent: May 26, 2026

(54) SYSTEMS AND METHODS FOR FLOATING POINT TO QUANTIZED GRID SAMPLING

(71) Applicant: Expedera, Inc., Santa Clara, CA (US)

(72) Inventors: Suhail Alnahari, Merced, CA (US); Sharad Chole, San Jose, CA (US)

(73) Assignee: Expedera, Inc., Santa Clara, CA (US)

( * ) Notice: Subject to any disclaimer, the term of this patent is extended or adjusted under 35 U.S.C. 154(b) by 221 days.

(21) Appl. No.: 18/491,611

(22) Filed: Oct. 20, 2023

(65) Prior Publication Data

US 2025/0131175 A1     Apr. 24, 2025

(51) Int. Cl.
| | |
|---|---|
| *G06F 30/30* | (2020.01) |
| *G06F 17/16* | (2006.01) |
| *G06F 30/27* | (2020.01) |
| *G06F 30/392* | (2020.01) |
| *G06N 3/02* | (2006.01) |
| *G06N 20/00* | (2019.01) |

(52) U.S. Cl.
CPC ............ *G06F 30/392* (2020.01); *G06F 17/16* (2013.01); *G06N 3/02* (2013.01); *G06N 20/00* (2019.01); *G06F 30/27* (2020.01)

(58) Field of Classification Search
None
See application file for complete search history.

(56) References Cited

U.S. PATENT DOCUMENTS

| | | | | |
|---|---|---|---|---|
| 11,893,490 | B2 * | 2/2024 | Kundu | ..................... G06N 3/09 |
| 12,045,307 | B2 * | 7/2024 | Khailany | .............. G06F 7/5443 |
| 2022/0044114 | A1 | 2/2022 | Sriram et al. | |
| 2022/0067530 | A1 | 3/2022 | Khailany et al. | |
| 2023/0087364 | A1 | 3/2023 | Kundu et al. | |

* cited by examiner

*Primary Examiner* — Leigh M Garbowski
(74) *Attorney, Agent, or Firm* — Carr & Ferrell LLP

(57) ABSTRACT

A method and system for quantized grid sampling of a tensor on customized digital hardware. The method and system receive a floating-point input tensor having one or more tensor dimensions and a grid point that are performed in as quantized values. The quantized values generation and processing can be performed using digital hardware performing quantized operation including digital shifts and quantized multiplication and additions. For each of the one or more of tensor dimensions adjacent to the grid point a quantized-floor-index is determined. A domain shifted floor index is determined for each quantized-floor-index. Weights are determined for each quantized-floor-index. Data values of the tensor points adjacent to the grid point are accessed and a weighted sum grid sample point is generated.

14 Claims, 7 Drawing Sheets

400

410: Receiving a floating-point input tensor having at a plurality of tensor dimensions.

420: Receiving a floating-point grid point.

430: Determining a quantized-floor-index for each of the one or more of tensor dimensions adjacent to the floating-point grid point by RequantizeRightShift(the floating-point grid, K) for each dimension of the grid point.

440: Determining a quantized domain shifted floor index for each quantized-floor-index by LeftShift(quantized-floor-index, K).

450: Determining a quantized scaled first weight for each the quantized-floor-index, by a Mask(LeftShift(floating-point grid point, K) – domain shifted floor index, K)

460: Determining a quantized scaled second weight for each the quantized-floor-index, by subtracting the associated quantized scaled first weight from 2^K:

470: Retrieving one or more floor data and floor data plus 1 values corresponding to the quantized floor index and quantized floor index plus 1 for each of the one or more of tensor dimensions data values.

480: Determining a quantized GridSample of the floating-point grid-point by generating a weighted sum utilizing the retrieved one or more floor and floor plus 1 data values and the quantized scaled first weight and the quantized scaled second weight.

D3 = Input(x3)

D4 = Input(x4)

W1 = X' – x3

W2 = 1- W1

GridSample1D = D3*W1 + D4*W2

$\qquad\qquad$ =(D3-D4)*W1 +D4

X_0 = floor(X')

D3 = Input(X_0)

D4 = Input(X_0 + 1)

W1 = X' – X_0

W2 = 1- W1

GridSample1D = D3*W1 + D4*W2

$\qquad\qquad$ =(D3-D4)*W1 +D4

Figures 2A, 2B:
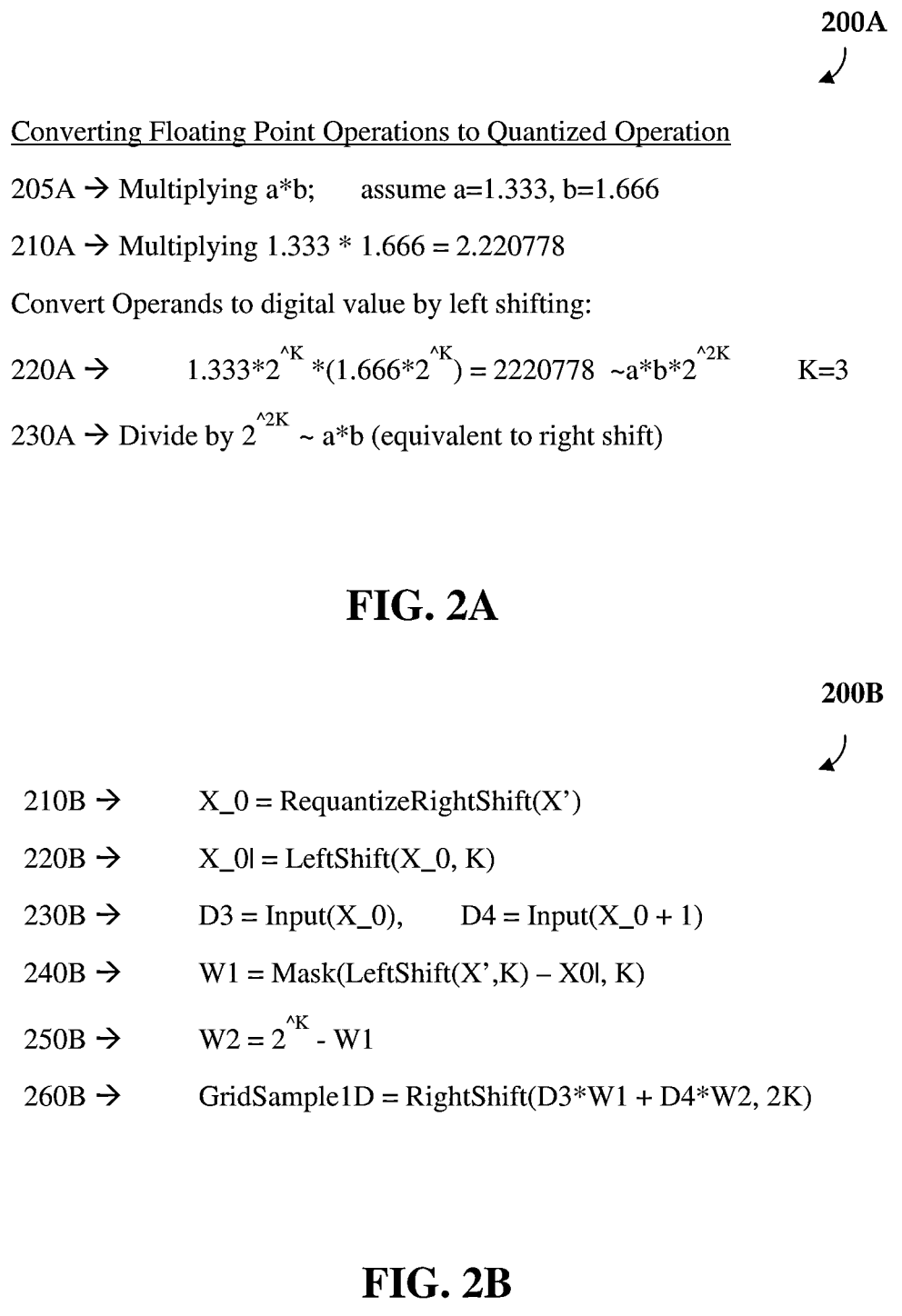

200A

Converting Floating Point Operations to Quantized Operation

205A → Multiplying a*b;    assume a=1.333, b=1.666

210A → Multiplying 1.333 * 1.666 = 2.220778

Convert Operands to digital value by left shifting:

220A →    $1.333*2^{\wedge K} *(1.666*2^{\wedge K}) = 2220778 \sim a*b*2^{\wedge 2K}$    K=3

230A → Divide by $2^{\wedge 2K} \sim a*b$ (equivalent to right shift)

210B →    X_0 = RequantizeRightShift(X')

220B →    X_0l = LeftShift(X_0, K)

230B →    D3 = Input(X_0),    D4 = Input(X_0 + 1)

240B →    W1 = Mask(LeftShift(X',K) – X0l, K)

250B →    $W2 = 2^{\wedge K} - W1$

260B →    GridSample1D = RightShift(D3*W1 + D4*W2, 2K)

FIG. 2B $$D[2,2] = Input(x2, y2)$$
$$D[3,2] = Input(x3, y2)$$
$$D[2,3] = Input(x2, y3)$$
$$D[3,3] = Input(x3,y3)$$

$$W1 = X' - x2 \qquad W3 = Y' - y2$$
$$W2 = 1 - W1 \qquad W4 = 1 - W3$$

$$GridSample2D = (D[2,2]*W2 + D[3,2]*W1)*W4 +$$
$$(D[2,3]*W2 + D[3,3]*W1)*W3$$

400

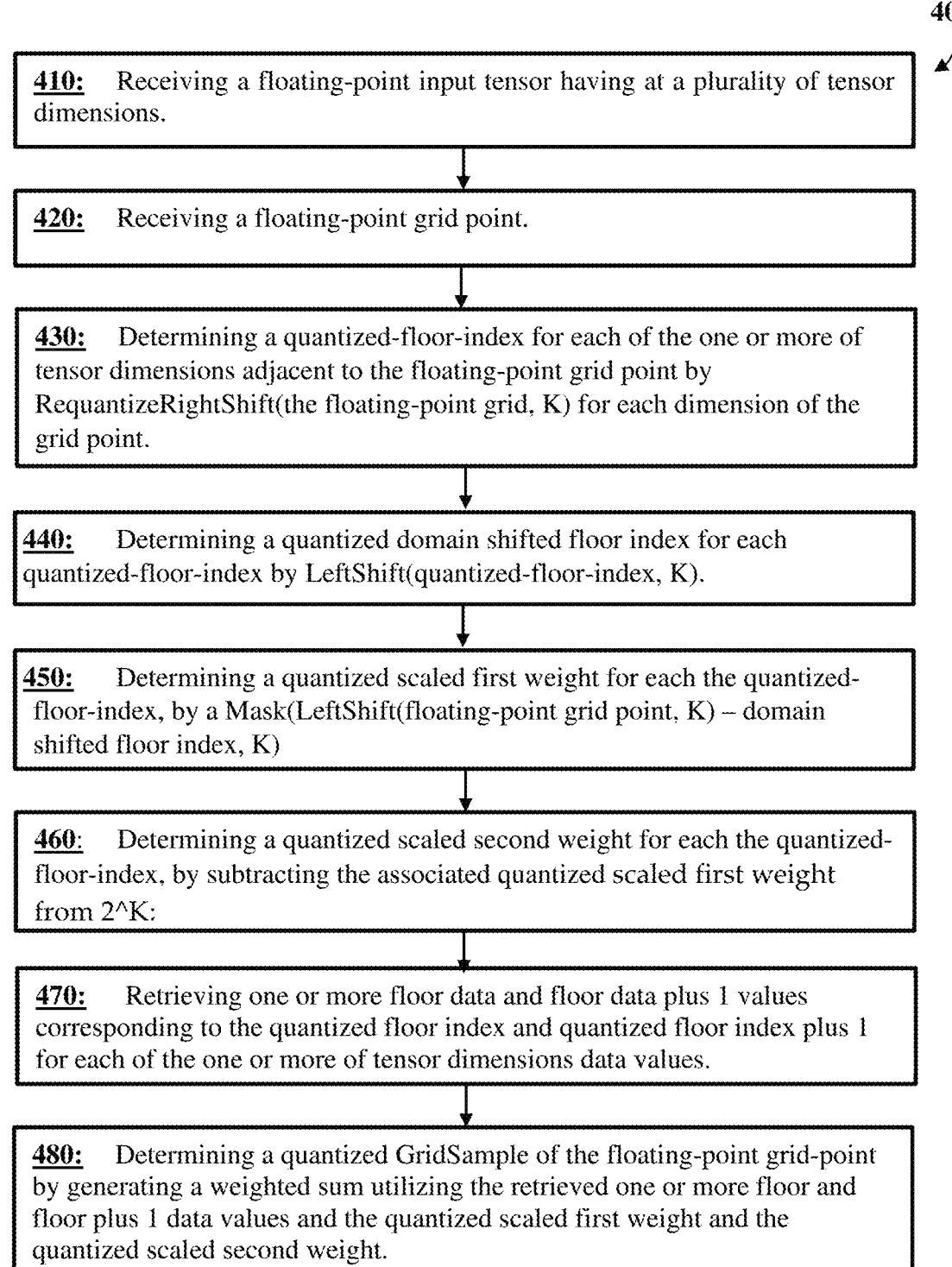

410:    Receiving a floating-point input tensor having at a plurality of tensor dimensions.

420:    Receiving a floating-point grid point.

430:    Determining a quantized-floor-index for each of the one or more of tensor dimensions adjacent to the floating-point grid point by RequantizeRightShift(the floating-point grid, K) for each dimension of the grid point.

440:    Determining a quantized domain shifted floor index for each quantized-floor-index by LeftShift(quantized-floor-index, K).

450:    Determining a quantized scaled first weight for each the quantized-floor-index, by a Mask(LeftShift(floating-point grid point, K) – domain shifted floor index, K)

460:    Determining a quantized scaled second weight for each the quantized-floor-index, by subtracting the associated quantized scaled first weight from 2^K:

470:    Retrieving one or more floor data and floor data plus 1 values corresponding to the quantized floor index and quantized floor index plus 1 for each of the one or more of tensor dimensions data values.

480:    Determining a quantized GridSample of the floating-point grid-point by generating a weighted sum utilizing the retrieved one or more floor and floor plus 1 data values and the quantized scaled first weight and the quantized scaled second weight.

FIG. 4

SYSTEMS AND METHODS FOR FLOATING POINT TO QUANTIZED GRID SAMPLING

TECHNICAL FIELD

The present application relates to the field of specialized semiconductor circuits and hardware, providing devices and methods for computationally efficient grid sampling operations on tensors. These operations are commonly used in neural networks addressing motion and optical flow, feature maps, and other tensor transforms. In particular, but not by way of limitation, the present invention discloses semiconductor circuits and methods for quantized grid sampling by digital semiconductor hardware.

BACKGROUND

It should not be assumed that any of the approaches described in this section qualify as prior art merely by virtue of their inclusion in this section. Grid sampling can be based on floating point numbers. However, there are benefits if the grid sampling computations can remain in the quantized domain and avoid conversion to floating point numbers. If all the calculations are performed in floating point numbers, the process is slower than computations such as adds and multiplies using quantized values. Further, the semiconduction real estate required for performing floating point operations is greater than for integer semiconductor hardware. Additionally, there is a design, performance, and development cost for ensuring that the floating-point calculations are compliant with IEEE standards. Thus, if the grid sampling calculations can be performed using quantized operations, the semiconductor real estate can be saved, system design times reduced, and system performance improved. What is needed are methods and digital semiconductor structures that improve the efficiency of grid sampling.

SUMMARY

This summary is provided to introduce a selection of concepts in a simplified form that is further described below in the Detailed Description of Example Embodiments. This summary is not intended to identify key features or essential features of the claimed subject matter, nor is it intended to be used as an aid in determining the scope of the claimed subject matter.

In one aspect of the invention, a method for quantized grid sampling a tensor on customized digital hardware is disclosed. The method comprises receiving a multidimensional floating-point input tensor. A grid point is received, which is used to grid on the input. The input values within the grid are then interpolated (grid sampled) to generate one output value.

Next, each of the tensor dimensions adjacent to the grid point is quantized by a software or hardware function. The requantizing transforms the grid point to a different quantized domain. The RequantizeRightShift (floating-point grid point, K) determines a quantized-floor-index for each of the tensor dimensions adjacent to the grid point. This function can be implemented by a hardware shift register. The value "K" is the precision of the grid points, and thus the shifting provides an integer value of the grid point in a dimension. This is repeated for each of the input tensor dimensions.

Next, the quantized-floor-indexes are converted to a higher domain. This determination is made by a function LeftShift (grid point, K), which can be implemented in software or hardware. The hardware implementation of the function is performed by determining domain shifting of the floor index for each quantized-floor-index by "K" bits.

Next, a quantized-scaled-first weight for each of the quantized-floor-indexes is determined for each tensor slice index. The quantized-scaled-weight value can be determined using the function Mask (LeftShift (grid point, K)-domain shifted floor index, K). This determines the first weight for a tensor dimension. This function is repeated for each tensor dimension.

A second quantized scaled second weight for each of the quantized-floor-index is determined by subtracting the associated quantized scaled first weight from $2^K$. This can be a quantized operation implemented in hardware.

The floor data values corresponding to the quantized floor index for each of the one or more of tensor dimensions are retrieved for each of the one or more of tensor dimensions.

A quantized GridSample is determined by generating a weighted sum utilizing the retrieved floor and floor plus 1 data values and utilizing the quantized scaled first weight and the quantized scaled second weight to interpolate between the data values. In general, to generate the quantized grid-sampled grid over an input grid, the weights for each grid point are generated and are interpolated between the data values within that grid. This step can be completed with a hardware implementation with quantized multiply and add hardware, and shift and add hardware.

BRIEF DESCRIPTION OF THE DRAWINGS

Exemplary embodiments are illustrated by way of example and not limited by the figures of the accompanying drawings, in which like references indicate similar elements.

FIG. 2A—Is an example of the methodology of performing quantized operations with floating point numbers.

FIG. 2B—Is an example of the bit operations for performing quantized one-dimensional grid sampling with floating point numbers.

FIG. 4—Is a flowchart for providing a method for performing a tensor transform.

DETAILED DESCRIPTION OF EXAMPLE EMBODIMENTS

Figures 1A, 1B, 1C:
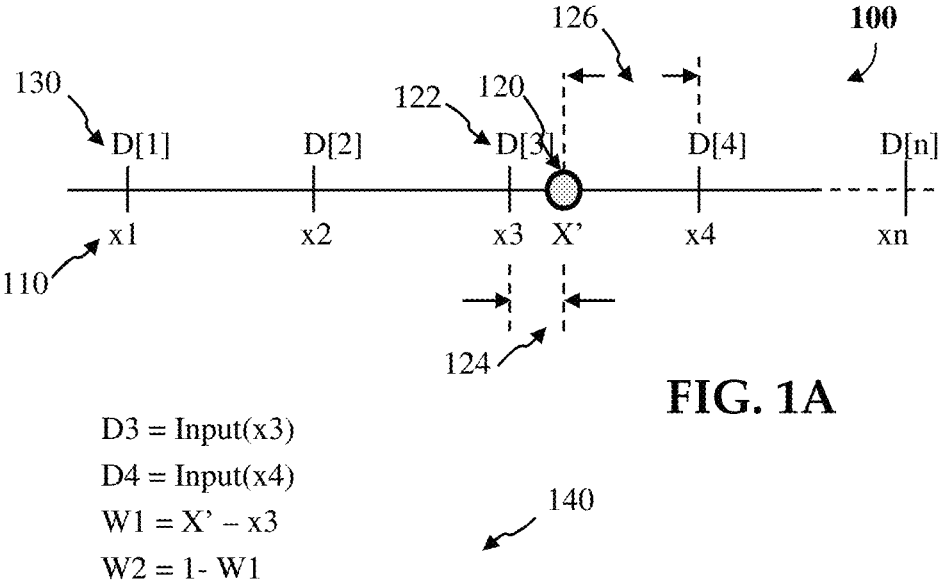
FIG. 1A—Is a figure of one-dimensional grid sampling.
FIG. 1B—Shows the steps to generate a one-dimensional grid sample.
FIG. 1C—Shows the steps to generate a quantized one-dimensional grid sample using quantization steps.

The following detailed description includes references to the accompanying drawings, which are a part of the detailed description. The drawings show illustrations in accordance with exemplary embodiments. These exemplary embodiments, which are also referred to herein as "examples," are described in enough detail to enable those skilled in the art to practice the present subject matter. The embodiments can be combined, other embodiments can be utilized, or structural, functional, logical, and electrical changes can be made without departing from the scope of what is claimed. The following detailed description is, therefore, not to be taken in a limiting sense, and the scope is defined by the appended claims and their equivalents.

FIG. 1 is a depiction 100 of a one-dimensional array x1-xn 110 or a tensor having the associated data values D[1]-D[n] 130. This one-dimensional stream of data 130 is used to map to a grid point X' 120 using grid sampling. While only one grid point 120 is shown, the grid can be a sequence of evenly or unevenly spaced grid points or grid flow points. The grid sampling is performed using a method or process 140. In this process, the data value D3 122 at point x3 and the data value D4 at point x4 are accessed. The points x3 and x4 are the incremental data points and, therefore differ by the value one. The weights, W1 and W2, 124, 126 in relationship to x3 and x4 are determined by the distance between X' and x3 124 and X' and x4 126. Because the input points are separated by a distance of one, the weight W2 can be generated by subtracting W1 from 1. The grid sampled value for X', "GridSample1D can be determined by the calculation below:

$$GridSample1D = D3 * W1 + D4 * W2.$$

This equation can be reduced to:

$$GridSample1D = (D3 - D4) * W1 + D4.$$

The advantage of this equation is that it reduces the number multiplies by one, that the calculation of W2 is more compute efficient, and requires less hardware such as an additional multiplier and adder when performing the calculations in parallel.

The process of one-dimensional grid sampling can also be performed as shown in 150. This representation is more adaptable to quantized operations that are implementable in hardware. A floor function:

$$X\_0 = floor(X')$$

generates the closest input index to the grid point in this dimension. For this example, the value would be the x3 index. To access the data adjacent to the grid point, the data at the index and index plus 1 is generated from the floor (X') operation.

$$D3 = Input(X\_0)$$
$$D4 = Input(X\_0 + 1)$$

Because the input values differ by one, the weights which are equivalent to the distance between X3 and X' and X' and X4 are easily generated using the formula:

$$W1 = X' - X\_0$$
$$W2 = 1 - W1$$

FIG. 2A is a depiction 200A of how a floating point multiply can be converted to a quantized integer operation to provide a substantially equivalent result. At step 205A, two floating point numbers are to be multiplied, "a*b." If, for example "a" is 1.333 and "b" is 1.666, the operation 210A would result in 2.220778.

In step 220A, the operands are scaled to a new dimension. The scaling can be by a precision level of the floating-point number. As shown, the scaling is by $2^{-K}$, which results in 1333*1666 equaling the quantized value 2220778. In this example, the scaling is 10^3.

To perform this multiplication as an efficient integer operation 220A, the operation left shifts both operands by the precision level of the floating-point number. This value is represented as "K" in this calculation. Because integer operands do not have a decimal point, the floating-point numbers need to be converted to an integer. This can be performed by multiplying by the number of bits of accuracy of the number. The easiest and most hardware-efficient method is to left shift the operand value by the number of significant digits after the decimal point.

In step 230A, the result of the multiplication in the higher dimension is restored to the original dimension by dividing by $2^{-2K}$. This step is equivalent to a right-shift 2K bits. This step is preferably performed in a hardware implementation of a shift register for speed and simplicity.

These steps form the foundation of performing a quantized grid sample from floating point numbers.

FIG. 2B shows an exemplary process 200B for generating a quantized grid sample of grid values. This technique can be expanded to quantized grid sampling of more than one dimension. In step 210B, the floor value of the grid sample X' is determined to generate the Input index value to access input data. This floor value which is the first adjacent Input index value to access data X'. As shown in FIG. 1A, this is x3. This value is generated by shifting X' to the right until only the non-fractional part of the X' index is in X_0. This shifting can be done by a hardware shift register in conjunction with a sequencer.

In step 220B, the floor values are scaled to a higher dimension to support quantized math, namely integer multiplication and integer addition. This step can be implemented by specialized hardware using a shift register in conjunction with a sequencer to control shift registers and the flow of data.

In step 230B, the Input data values at the floor and the floor plus 1 are accessed. These represent the two values D3 and D4 are from the two closest points along the tensor dimension. If there are more tensor dimensions, additional data values would be retrieved from the Input tensor dimensions adjacent to each grid point. These points can be scaled by the precision value "K" to support quantized operations with weights.

In step 240B, a first weight is generated. The LeftShift (X',K) shifts the fractional part of X' to the left. For example, if the value was 4.625, the left shift by the precision value of the number would result in "4625." X0| is a shifted floor value of "4000." The difference is "625" which is a scaled value of the percentage that the X' value is from the floor.

In step 250B, a second weight is generated. Since the distance between input data is "1", or a scaled 1000, then the remaining distance 1000-625 is the scaled second weight value. This calculation can be performed in digital hardware as a quantized integer operation. If the input tensor had more than one dimension, then this operation would be performed for each dimension.

In step 260B, the one-dimensional grid sample is generated. The weighted values, D3*W1, D4*W2, are generated in a quantized multiplication and summed in a quantized operation.

Figure 3:
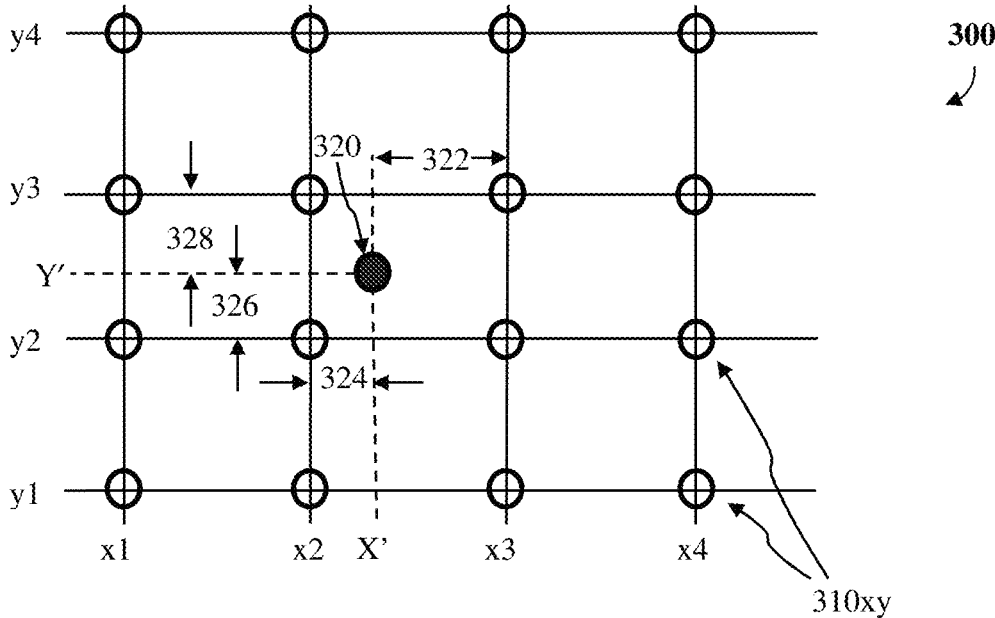
FIG. 3—Is an example of a two-dimensional tensor and interpolation of a tensor slice to generate an output.

FIG. 3 is a depiction 300 of a two-dimensional array of data points D[x1-xn, y1-yn] 310xy, also referred to as a tensor. This two-dimensional array of data is mapped to a grid point X' 320 using grid sampling. While only one grid point 320 is shown, the grid can be a sequence of evenly or unevenly spaced grid points. The grid sampling is performed using a method or process 340. In this process, the data values around the grid location X', Y' are accessed. The points x2,y2 and x3,y2 are the incremental data points and differ by a value of one in the x direction. The points x2,y3 and ×3,y3 are the incremental data points and differ by a value of one in the x direction. Because the weights are based on the fractional distance between the x,y data points, these are all less than one. This is a useful attribute that helps in the computation of weights in the quantized digital domain.

The point X',Y' weights, W1 322, W2 324, W3 326, and W4 328 are determined by the distance between X' and x2 324 and X' and x3 322 and Y' and y2 326 and Y' and y3 328. Because the input points are separated by a distance of one, the weights W2, W4 can be generated by subtracting W1 from 1 and W4 from 1. The grid sampled value for X' Y', "GridSample2D can be determined by the calculation below:

$$GridSample2D =$$

$$(D[2, 2] * W2 + D[3, 2] * W1) * W4 + (D[2, 3] * W2 + D[3, 3] * W1) * W3$$

FIG. 4 shows a flow chart 400 for performing a floating point to quantized grid sampling.

In step 410, a floating-point Input tensor is received. The coordinates within the tensor can be integer references. The tensor can have one, two, or more dimensions.

In step 420, a grid point location is received. This location will lie within the Input tensor. The grid point can include the same number of dimensions as the Input tensor.

In step 430, a quantized-floor-index for each of the one or more of tensor dimensions adjacent to the grid point is generated. This can be performed by the function RequantizeRightShift (the floating-point grid, K) for each dimension of the grid point. The function:

$$RequantizeRightShift(X',k)$$

takes a grid location X' in a dimension, shifts the number over by "K" bits. For example, if the tensor has two dimensions, and X' is at the location [5.625, 4.5] within the Input tensor. For the first dimension of:

$$X'[5.625, y] = 5.625_{(10)} = 101.101_{(2)}$$

$$RequantizeRightShift(5.625, K) = 5_{(10)} = 101_{(2)}$$

The fractional part or the precision level can be three, but the integer value is 5. By right shifting in binary by three, the precision value, the value $5_{(10)}$ or $101_{(2)}$, which represents a data input location on the lower side of the grid value. This generates a quantized value for accessing a dimension of an Input tensor. For a multi-dimensional tensor, this process is repeated for each dimension to determine the floor index in each dimension. This function can be performed by digital hardware by a digital shift register.

In step 440, a scaled quantized floor index for each quantized-floor-index by LeftShift (quantized-floor-index, K) is determined. This function shifts the domain of the quantized-floor-index so that the integer is compatible with integer computations with the weights. For example:

$$Leftshift(5, 3) = 5000$$

$$Leftshift(000101, 011) = 101000 \text{ in base2.}$$

Note that the number of shifts required for binary shifting will be greater than in the decimal representation. If there are more than one dimension in the tensor, this step will need to be repeated for each dimension.

In step 450, a scaled first weight is calculated. The grid coordinates are left shifted to generate a scale for the grid coordinate. From this value, the quantized floor value is subtracted. This value is a scaled percentage of the distance between data points. For example:

X' in a dimension has the coordinates 5.625.

Quantized floor is 5.

Scaled floor is 5000.

Scaled X' is 5625

Scaled X'−Scaled floor=625, which is the scaled weight W1.

In step 460, the second quantized scaled weight is calculated. Because the Input tensor data values differ by "1", or a scaled $10^{\wedge}K$ or $2^{\wedge K}$ for base 2, the second scaled value can be generated with the formula:

$$W2 = 2^{\wedge K} - W1$$

In step 470, the data surrounding the grid point tensor is read. For the one-dimensional tensor, this is the value at the quantized floor coordinate and the floor plus 1 coordinate. In the above example, this would be the tensor values Input [5,y, . . . ] and Input [6,y, . . . ] where y . . . represents the other tensor dimensions. For tensors with additional dimensions, the Input [ ] values in the floor and floor+1 for each dimension also need to be read.

In step 480, the GridSample for the grid-sample location is generated using the scaled quantized weights applied to the quantized data values around the grid-sample location.

Figure 5:
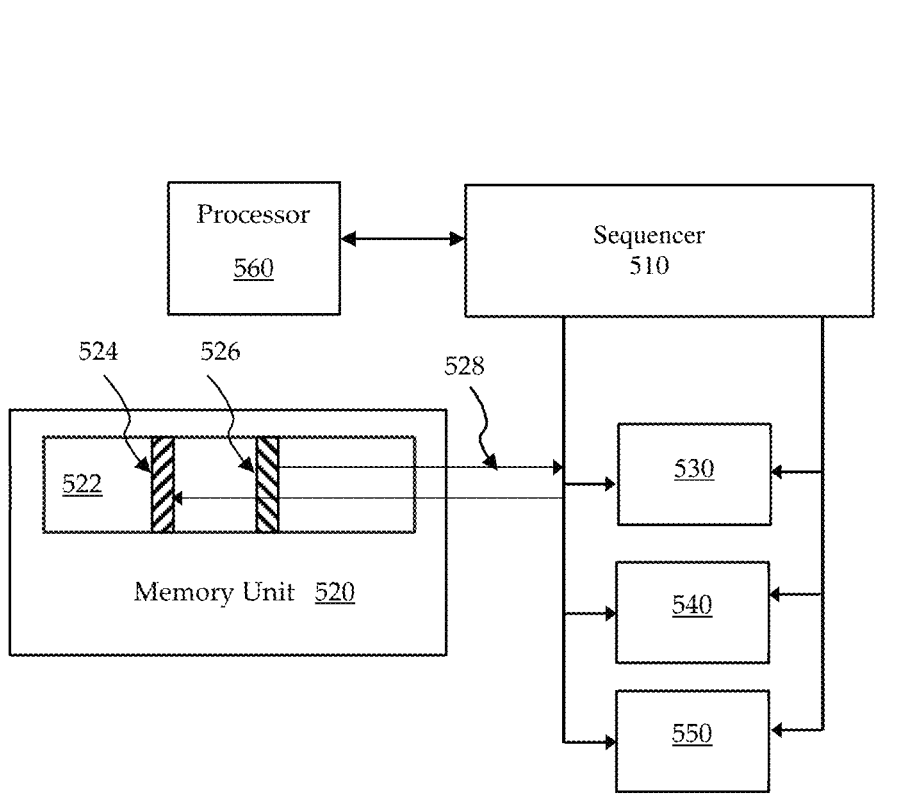
FIG. 5—Is an example of a system for performing floating point to quantized grid sampling.

FIG. 5 provides a system block diagram 500 of semiconductor logic blocks configured to perform quantized grid sampling of floating point numbers in customized digital hardware. The system can include a processor 560, a sequencer 510, a memory unit 520, computational logic including one or more digital shift registers 530, one or more logical masking logic 540, and one or more digital multiply and add logic 550.

The processor 560 can provide high-level control for generating quantized grid sampling of a floating-point input. The processor 560 can be a digital signal processor, a microprocessor, a neural processor, or other customized computational logic suitable for the above-mentioned functions.

The sequencer 510 includes the microelectronics required to control the data flow for flow from memory to the logic processing components, including but not limited to one or more digital shift registers 530, one or more logical masking logic 540, and one or more digital multiply and add logic 550.

The sequencer 510 can also provide control over the memory unit 520 for the flow of tensor data 524 and grid data 526 and control the data flow 528 and sequence of processing through logic blocks 530, 540, and 550.

The memory unit 520 can include a plurality of memory blocks 522 to support parallel processing of computations for tensors with more than one dimension. These blocks can include the source tensor data 526. The quantized grid sample data 524 can be stored back into the memory unit 520.

Figure 6:
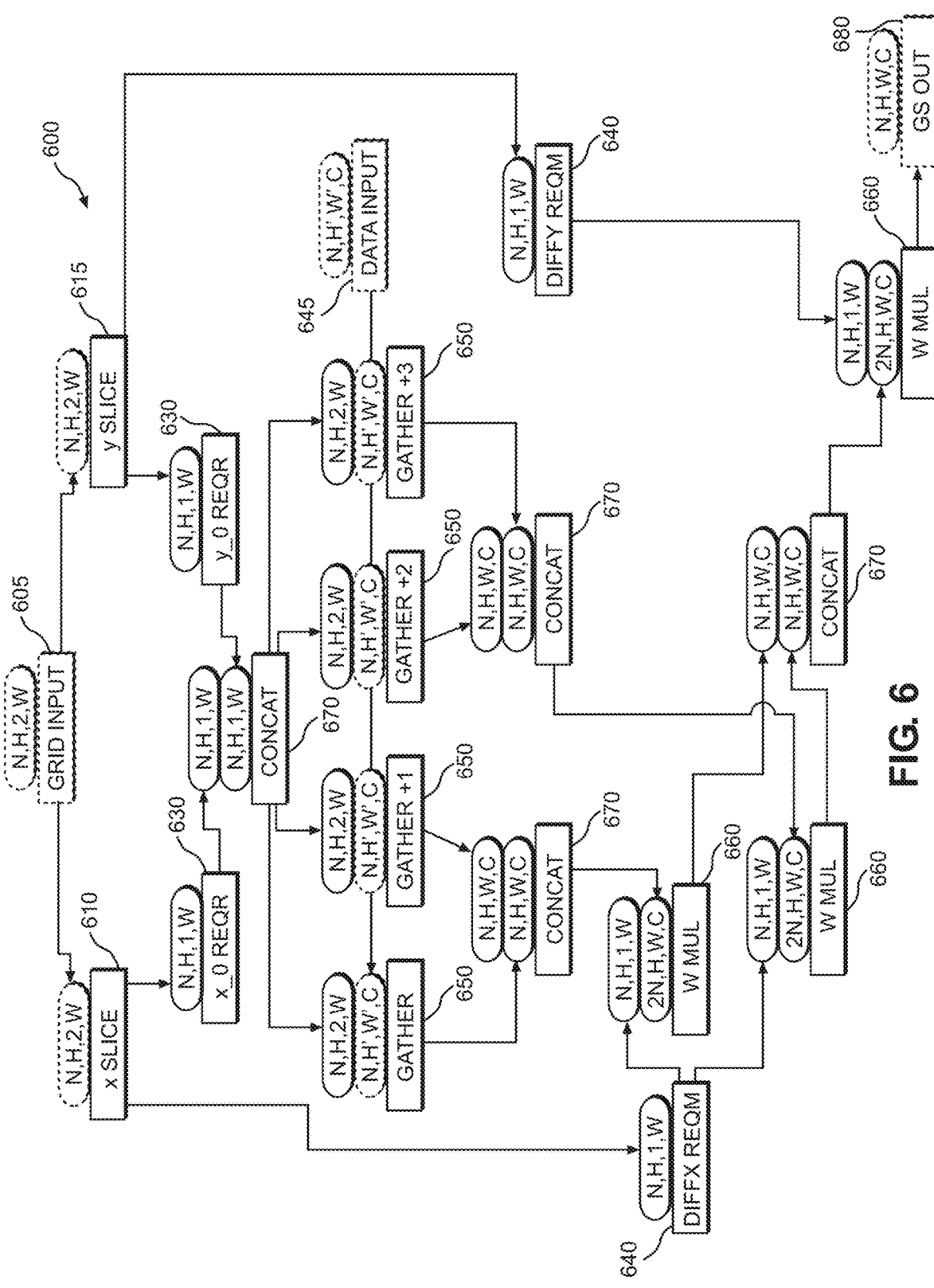
FIG. 6—Is an example of the data flow and processing steps for a 2-D grid sampling.

FIG. 6 provides a data and processing flow diagram 600 for 2-D grid sampling. The processing flow begins with the input of a 2-D grid 605. The elliptical shape above the blocks 6xx represents the size of data at that processing step. For example, (N, H, 2, W) represents N channels, a height of H pixels, "2" dimensions, and a width of W.

From the grid input 605, a slice in the X dimension 610 and a slice in the Y dimension 615 are selected. The X slice index 610 and Y slice indexes 615 are utilized by a hardware implementation 630 where they are requantized to a new dimension by a right shift. The requantized values are concatenated 670 to provide the coordinates for gathering 650 the four data values around the grid input 605 index from a data input 645. The weight values for the X index value and the Y index values are generated by the hardware 640 that shifts and masks the X index values and the Y values. The hardware weight values are multiplied with the gathered 650 four data values and generates a grid sample output 680.

Figure 7:
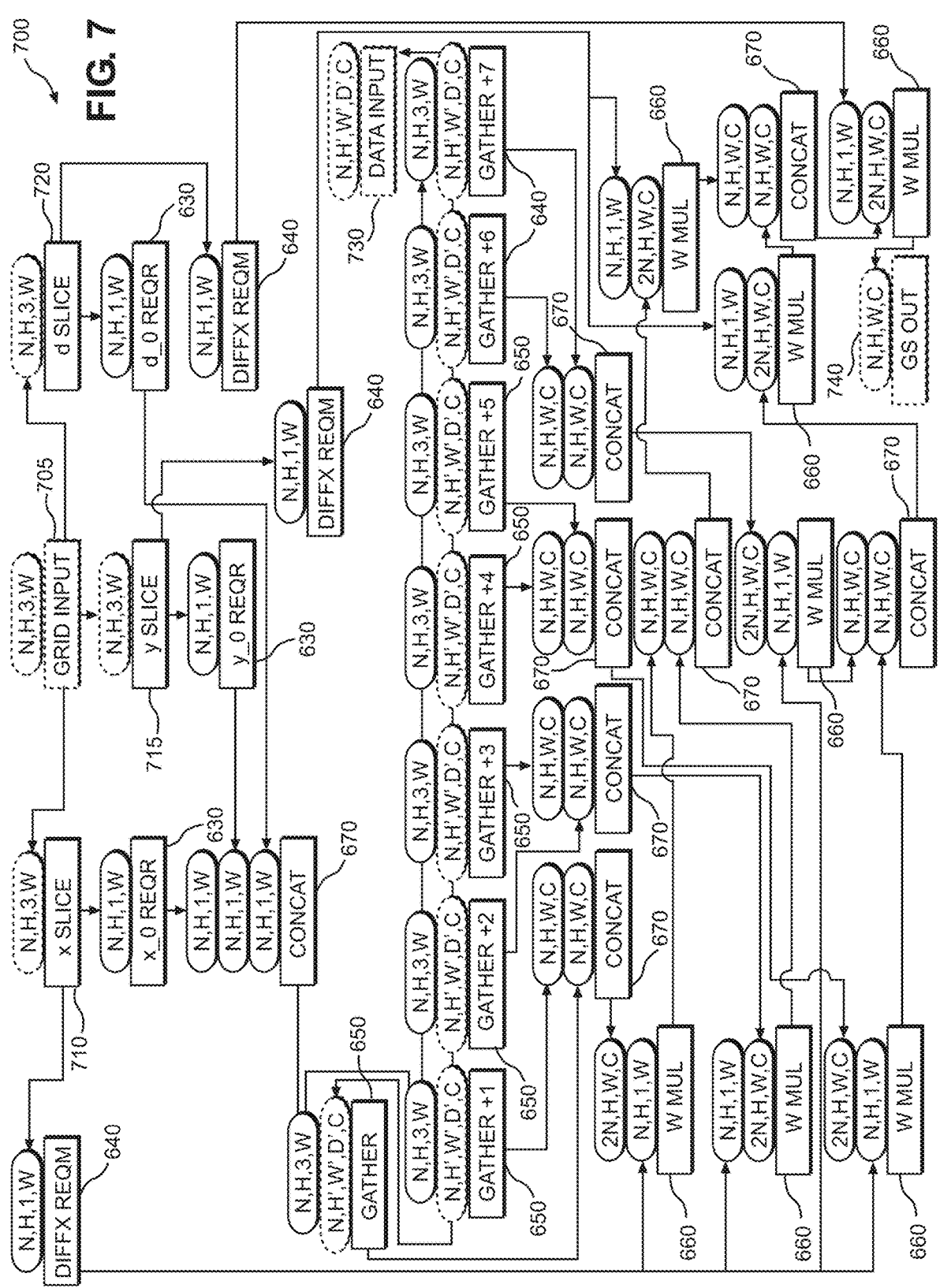
FIG. 7—Is an example of the data flow and processing blocks for 3-D grid sampling.

FIG. 7 provides a data and processing flow diagram 700 for 3-D grid sampling. The processing flow begins with the input of a 3-D grid 705. The elliptical shape above the blocks 6xx and 7xx represents the size of data at that processing step. For example, (N, H, 3, W) represents N channels, a height of H pixels, "3" dimensions, and width of W.

From the grid input 705, a slice in the X dimension 710, a slice in the Y dimension 715, and a slice in the D (depth) dimension 720 are selected. The X slice index 710 and Y slice indexes v, and D slice indexes 720 are utilized by a hardware implementation 630 where they are requantized to a new dimension by a hardware right shift. The requantized values are concatenated 670 to provide the coordinates for gathering 650 the eight data values around the grid input 705 index from a data input 730. The weight values for the X index value, the Y index values, and the D index value are generated by the hardware 640 that shifts and masks the X index values, the Y values and the D index values. The hardware weight values are multiplied with the gathered 650 eight data values and generates a grid sample output 740.

The corresponding structures, materials, acts, and equivalents of all means or step plus function elements in the claims below are intended to include any structure, material, or act for performing the function in combination with other claimed elements as specifically claimed. The description of the present technology has been presented for the purposes of illustration and description but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application and to enable others of ordinary skill in the art to understand the present technology for various embodiments with various modifications as are suited to the particular use contemplated.

Aspects of the present technology are described above with reference to flowchart illustrations and/or block diagrams of methods and apparatus (systems) according to embodiments of the present technology.

The flowchart and block diagrams in the Figures illustrate the architecture, functionality, and operation of possible implementations of systems, methods, and computer program products according to various embodiments of the present technology. In this regard, each block in the flowchart or block diagrams may represent a module, section, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or combinations of special purpose hardware.

In the following description, for purposes of explanation and not limitation, specific details are set forth, such as particular embodiments, procedures, techniques, etc., in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment," "in an embodiment," or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms, and a plural term may include its singular form. Similarly, a hyphenated term (e.g., "on-demand") may occasionally be interchangeably used with its non-hyphenated version (e.g., "on-demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments, the "means for" is expressed in terms of a mathematical formula, prose, or as a flow chart or signal diagram.

The terminology used herein is for the purpose of describing particular embodiments only and is not intended to be limiting of the invention. As used herein, the singular forms "a," "an," and "the" are intended to include the plural forms as well unless the context clearly indicates otherwise. It will be further understood that the terms "comprises" and/or "comprising," when used in this specification, specify the presence of stated features, integers, steps, operations, elements, and/or components but do not preclude the presence or addition of one or more other features, integers, steps, operations, elements, components, and/or groups thereof.

It is noted that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purposes only and are not drawn to scale.

If any disclosures are incorporated herein by reference and such incorporated disclosures conflict in part and/or in whole with the present disclosure, then to the extent of conflict, and/or broader disclosure, and/or broader definition of terms, the present disclosure controls. If such incorporated disclosures conflict in part and/or in whole with one another, then to the extent of conflict, the later-dated disclosure controls.

While various embodiments have been described above, it should be understood that they have been presented by way of example only and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method for quantized grid sampling a tensor on customized digital hardware comprising:

receiving a floating-point input tensor having one or more of tensor dimensions;

receiving a grid point;

determining a quantized-floor-index for each of the one or more of tensor dimensions adjacent to the grid point by RequantizeRightShift (floating-point grid point, K) by a precision number K for each dimension of the grid point, thereby generating the quantized-floor-index for each of the one or more of the tensor dimensions;

determining a domain shifted floor index for each quantized-floor-index by LeftShift (the floating-point grid point, K);

determining a quantized scaled first weight for each the quantized-floor-index by a Mask (LeftShift (floating-point grid point, K)—the domain shifted floor index, K);

determining a quantized scaled second weight for each quantized-floor-index by subtracting the associated quantized scaled first weight from $2^K$;

retrieving one or more floor data values corresponding to the quantized-floor-index for each of the one or more of the tensor dimensions;

retrieving one or more floor plus one data values corresponding to the quantized-floor-index plus one for each of the one or more of the tensor dimensions; and determining a quantized GridSample of the floating-point grid point by generating a weighted sum utilizing the retrieved one or more floor and floor plus 1 data values and the quantized scaled first weight and the quantized scaled second weight.

2. The method of claim 1, wherein the generating of the weighted sum is performed by a digital multiply and add circuit.

3. The method of claim 1, wherein K is less than eight.

4. The method of claim 1, wherein the quantized-floor-index for each of the one or more of the tensor dimensions adjacent to the grid point is generated by a hardware shift register.

5. The method of claim 1, wherein the LeftShift(floating-point grid point, K) is generated by a hardware shift register.

6. The method of claim 1, wherein the RequantizeRightShift( ) function is generated by a hardware shift register.

7. The method of claim 1, wherein the generating of the weighted sum is performed by a digital multiply and add circuit, the LeftShift (floating-point grid point, K) is generated by a hardware shift register, and the RequantizeRightShift () function is generated by a hardware shift register.

8. A system for quantized grid sampling a tensor on customized digital hardware comprising:

a sequencer;

one or more shift registers;

one or more digital adders and multipliers;

one or more digital masks;

wherein the sequencer is configured to receive a floating-point input tensor having one or more of tensor dimensions;

wherein the sequencer is configured to receive a grid point;

wherein the sequencer and the one or more shift registers generate a quantized-floor-index for each of the one or more of the tensor dimensions adjacent to the grid point by right shifting the grid point by K bits;

wherein the sequencer and the one or more shift registers determines a domain shifted floor index for each quantized-floor-index by one or more shift registers by left shifting the grid point by K bits;

wherein the sequencer and the one or more shift registers determines a quantized scaled first weight for each quantized-floor-index, by a Mask (LeftShift (grid point, K)-domain shifted floor index, K);

wherein the sequencer and the one or more shift register determines a quantized scaled second weight for each quantized-floor-index by subtracting the associated quantized scaled first weight from $2^K$;

wherein the sequencer and the one or more shift registers retrieves one or more floor data values corresponding to the quantized-floor-index for each of the one or more of the tensor dimensions;

wherein the sequencer and the one or more shift registers retrieves one or more ceiling data values corresponding to the quantized-floor-index plus one for each of the one or more of the tensor dimensions; and wherein the sewuencer and the one or more shift registers determines a quantized GridSample of the floating-point grid point by generating a weighted sum of the quantized scaled first weight and the quantized scaled second weight for each quantized-floor-index.

9. The system of claim 8, wherein the generating of the weighted sum is performed by a digital multiply and add circuit.

10. The system of claim 8, wherein K is less than eight.

11. The system of claim 8, wherein the quantized-floor-index for each of the one or more of the tensor dimensions adjacent to the grid point is generated by a hardware shift register.

12. The system of claim 8, wherein the LeftShift (grid point, K) is generated by a hardware shift register.

13. The system of claim 8, wherein a RequantizeRight-Shift( ) function is generated by a hardware shift register.

14. The system of claim 8, wherein the generating weighted sum is performed by a digital multiply and add circuit, the LeftShift(grid point, K) is generated by a hardware shift register, and a RequantizeRightShift( ) function is generated by a hardware shift register.

* * * * *